United States Patent [19]

Noz

[11] 4,132,617
[45] Jan. 2, 1979

[54] APPARATUS FOR CONTINUOUS APPLICATION OF STRIP-, RIBBON- OR PATCH-SHAPED COATINGS TO A METAL TAPE

[75] Inventor: Francis X. Noz, Triesen, Switzerland

[73] Assignee: Galentan, A.G., Zug, Switzerland

[21] Appl. No.: 781,825

[22] Filed: Mar. 28, 1977

Related U.S. Application Data

[62] Division of Ser. No. 512,399, Oct. 4, 1974, abandoned.

[30] Foreign Application Priority Data

Oct. 4, 1973 [CH] Switzerland ............... 14211/73

[51] Int. Cl.² ........................................ C25D 17/00
[52] U.S. Cl. ............................... 204/206; 204/202
[58] Field of Search ............... 204/202, 15, 224 R, 204/13, 203–205, 206–211

[56] References Cited

U.S. PATENT DOCUMENTS

| | | | |
|---|---|---|---|
| 2,715,095 | 8/1955 | Cohn | 204/202 X |
| 2,927,889 | 3/1960 | Clinehens | 204/13 X |
| 3,274,092 | 9/1966 | Marantz | 204/224 R |
| 3,483,098 | 12/1969 | Kramer | 204/206 |
| 3,649,507 | 3/1972 | Welter | 204/202 |
| 3,855,108 | 12/1974 | Bolz | 204/206 |
| 3,896,010 | 7/1975 | Vetter | 204/206 X |
| 3,904,489 | 9/1975 | Johnson | 204/202 X |
| 3,951,772 | 4/1976 | Bick et al. | 204/202 X |
| 4,035,245 | 7/1977 | Danneels | 204/15 |

Primary Examiner—Charles F. Lefevour
Attorney, Agent, or Firm—Oblon, Fisher, Spivak, McClelland & Maier

[57] ABSTRACT

A method and apparatus for the continuous application of strip-, ribbon- or patch-shaped coatings of a noble metal to an electrically conductive tape by utilizing non-conductive belt means moving in concert with the tape as they simultaneously traverse an electrolitic solution. The non-conductive belt means shields the tape from the solution in those areas where a coating is not desired.

9 Claims, 16 Drawing Figures

APPARATUS FOR CONTINUOUS APPLICATION OF STRIP-, RIBBON- OR PATCH-SHAPED COATINGS TO A METAL TAPE

This application is a division of Ser. No. 512,399 filed Oct. 4, 1974 now abandoned.

This invention relates to a method and a device for the continuous application of strip-, ribbon- or patch-shaped coatings, for example, of a noble metal such as gold to an electrically conductive tape, which is propagated by an electrically insulating roller or a guide member across a solution of an electrolyte of the coating metal.

Electrical parts such as contacts, holders or semiconductor elements and integrated circuits are often punched from endless tapes. The selective application of, for example, gold layers to separate elements, that is to say the application to the areas where the layers have an operative function, is costly in labor and it is, therefore, important to provide the tapes prior to or after punching, when the products are still interconnected by means of auxiliary strips, with the required selective layer, for example, the gold layer.

In addition, the required metallic layer, usually a precious metal such as gold, is expensive so that a satisfactory, selective deposition and a sharp limitation of the required pattern will provide saving in cost and material.

The invention provides a method and a device which satisfy these requirements in an uncomplex manner. This invention enables a great variety of patterns of noble metal to be applied by a galvanic agency with great accuracy and at a high rate by means of expedients of low cost.

In this invention, the electrically conductive tape or strip is in fluid-tight contact with the surface of the roller or is in contact with a guide member and, in dependence upon whether a complete or partial coating with a metal layer or a pattern is desired, is on the outer side in liquid-tight contact with a second electrically insulating tape, which moves together with the first-mentioned tape and which partially covers the first tape and thus determines the patterns to be applied to the first tape.

The edges of the second tape extend parallel to those of the first tape, in which case the pattern on the first tape is rectilinear, or the second tape is provided with apertures of suitably chosen shape, which provides relatively separated patterns. In either instance, the worked tape or strip, if necessary after further treatment, can be divided into smaller portions for obtaining the desired shape and size of the objects.

If one side of the metal tape is to be completely coated with a gold layer, the second tape need, if desired, only by employed for rotating the roller or propelling the guide member or the second tape is not used at all. As a matter of course, in the case of complete gilding of one side of the metal tape, this second tape must not cover said metal tape.

It is furthermore possible to coat the electrically conductive tape partially on both sides with a layer or a pattern.

These and other objects of the invention will become more apparent to those skilled in the art by reference to the following detailed description when viewed in light of the accompanying drawings wherein.

Figure 1:
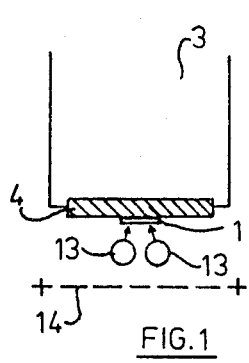
FIGS. 1 to 9 are diagrammatic views illustrating various examples of the method of coating the first tape by the second tape to obtain various patterns of coating.

Referring to FIGS. 1 to 9, reference numeral 3 designates a roller or guide member for a tape or strip 1. The roller 3 is provided with a weak, elastic coating to provide a fluid-tight seal of the inner side of the tape 1. Reference numeral 13 designates spray pipes for the desired electrolyte solution. Numeral 14 indicates the anode connected to the positive terminal of a direct-current source, the negative terminal of which is connected to the cathode.

FIG. 1 illustrates an example in which one side of the tape 1 is completely coated, for example, with a gold layer so that a second tape or further tapes 8 shown in FIGS. 2 to 9 are not employed.

Figure 2:
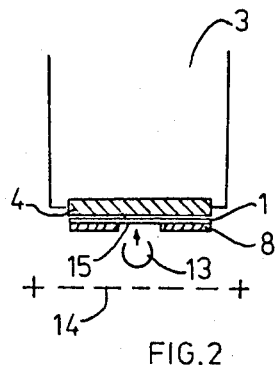

FIG. 2 illustrates a pair of spaced tapes 8 which partially cover in a fluid-tight manner the tape or strip 1. Thus, the tape 1 is gilded with a layer of the desired width 15. As a matter of course, such a strip layer may be applied to any selected area of tape 1.

Figure 3:
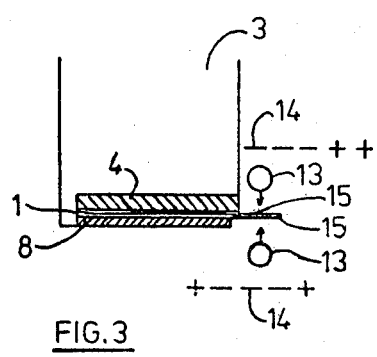

FIG. 3 illustrates how partially on two sides of the tape or strip layers or patterns 15 may be applied, in the first place because the tape or strip 1 is located partially beyond the righthand side of the elastic cover 4 and secondly because the tape 8 only partially covers the tape 1. The layers 15 on both sides of the tape do not require the same width as is indicated in FIG. 3.

Figure 4:
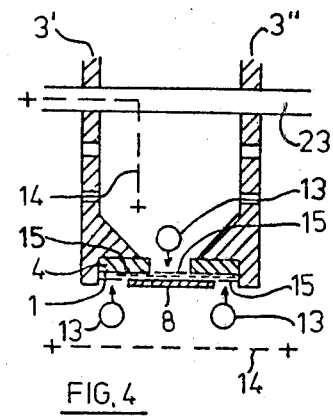

FIG. 4 illustrates an example of a divided roller 3' and 3" adapted to rotate about a hollow shaft 23 so that a spray pipe 13 for the supply of the electrolyte can be passed through the shaft 23. FIG. 4 illustrates that to the inner side of the tape 1, a layer or pattern 5 can be applied, while, for example, on the other side two layers or patterns 15 can be simultaneously applied.

Figure 5:
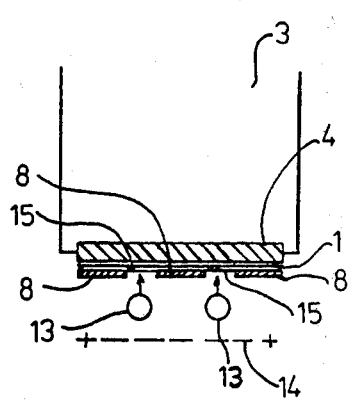
Figure 6:
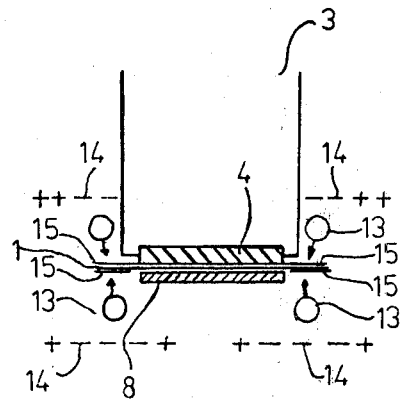
Figure 7:
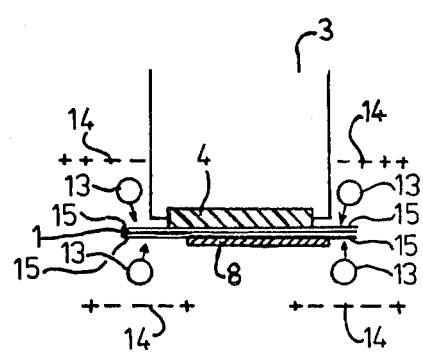

FIGS. 5, 6 and 7 illustrate further examples for the application of layers.

Figure 8A:
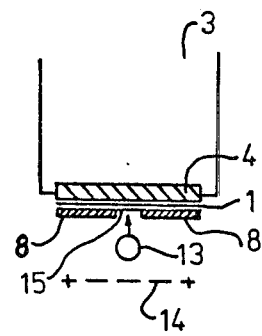
Figure 8B:
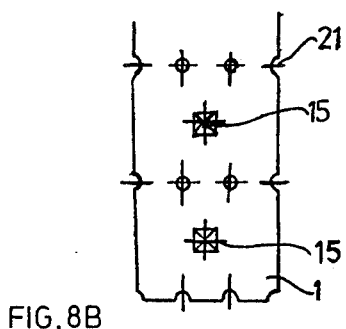
Figure 8C:
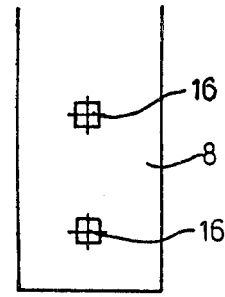

FIG. 8 illustrates one form of composition of the roller 3 with the elastic coating 4, the tape 1 and the covering tapes 8. FIG. 8B shows the tape 8 separately and the patches 15 representing the desired metal deposits which correspond to the apertures 16 of the tape 8 as shown in FIG. 8C. FIG. 8B shows further recesses 21.

Figure 9:
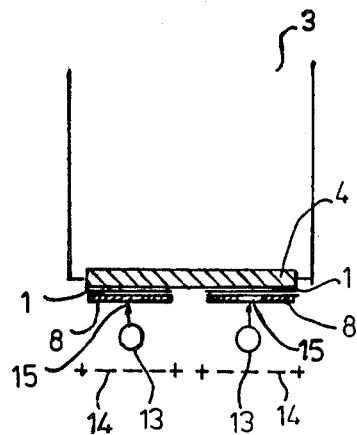

FIG. 9 illustrates that simultaneously a plurality of tapes 1, for example of the type shown in FIG. 8B, can be treated by the process of continuously applying strip-, ribbon- or patch-shaped coatings to a metal tape.

Figure 10:
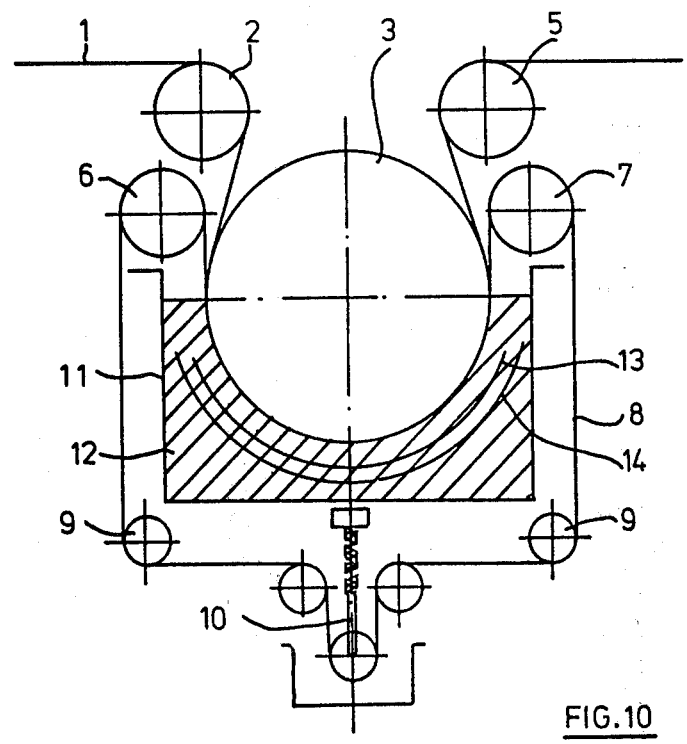
FIG. 10 illustrates an embodiment of a device in accordance with the invention.

Operation can be understood by reference to FIG. 10.

Figure 11:
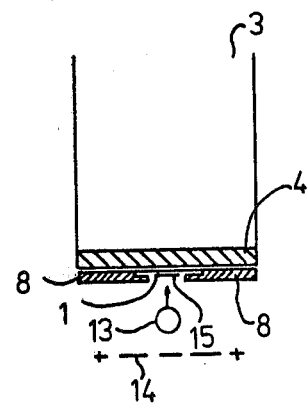
FIG. 11 is a side view illustrating another relative disposition of the tapes.

The tape 1 is passed via a guide roller 2 along the circumference of the wheel or roller 3. The circumference thereof is provided with a weak, elastic coating 4 (FIG. 11) so that a fluid-tight seal on the inner side of the tape 1 is obtained. The tape 1 leaves the roller 3 via a guide roller 5, on which, if desired, an after-treatment of the tape is carried out. The endless belt 8 is passed along the rollers 6 and 7. A plurality of such belts 8 may be provided, for example, as shown in FIG. 11. Belts 8 are formed by a core of weak, elastic material coated on the side engaging the tape 1 with a soft layer. The belts 8 are guided along the rollers 9 and a stretching member 10, which may be combined with a cleaning device for removing adhering electrolyte from the belt 8. The roller 3 is journalled in a container 11 which receives electrolyte 12. The container 11 contains a solution having a compound of the metal to be deposited. One or more nozzles 13 are provided for spraying the liquid against the surface of the tape 1 which is to be coated. This is carried out by a pumping means (not shown). The container 11 further comprises an anode 14 connected to the positive terminal of a direct-current source, the negative terminal of which is connected to tape 1. In this manner, the passage of current produces a metal deposit on the areas 15 of the tape 1, which is, for example, provided with a lineshaped coating and which leaves the roller 3 via the roller 5.

By an axial displacement of the rollers 2 and 5 the position of the deposit 15 can be adjusted as desired. Thus, by means of a single device, a line pattern is applied to tapes having different widths and at arbitrary and selected locations.

Figure 12:
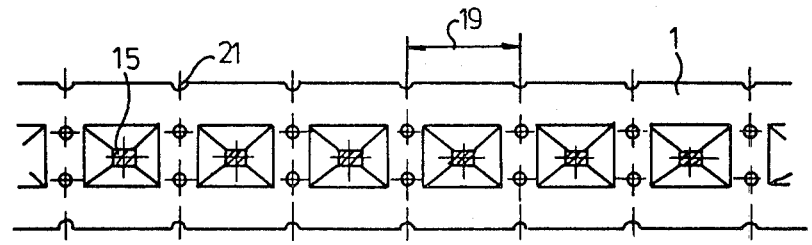
FIG. 12 is a plan view illustrating a patch-shaped distribution of deposits.
Figure 13:
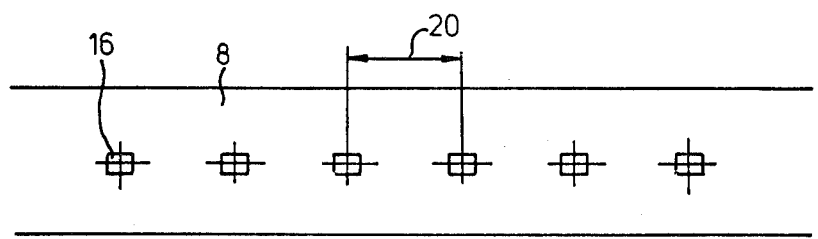
FIG. 13 is a plan view illustrating a perforation pattern in the second tape.

In FIGS. 1 to 9 the direction of flow of the electrolyte is indicated by arrows. In FIG. 1, a surface is coated throughout its width, whereas in FIG. 2 a coating of only the central part is illustrated. FIG. 3 shows a coating of the two sides of a tape and FIG. 4 shows the coating of the two edges and on the other side a coating of the tape 1. FIG. 5 shows the simultaneous coating of two lines or strips on a tape, whereas FIG. 6 shows two edge deposits on two sides like FIG. 7, the widths on the two sides being, however, different. In the latter two cases, as in FIG. 3, the rear side of the tape has to be partially free. FIGS. 8 and 9 show the possibility of applying separate coatings. FIG. 9 shows the simultaneous treatment of two tapes. FIG. 12 illustrates the application of a patch-shaped pattern with the aid of a perforation of the kind shown in FIG. 13.

Figure 14:
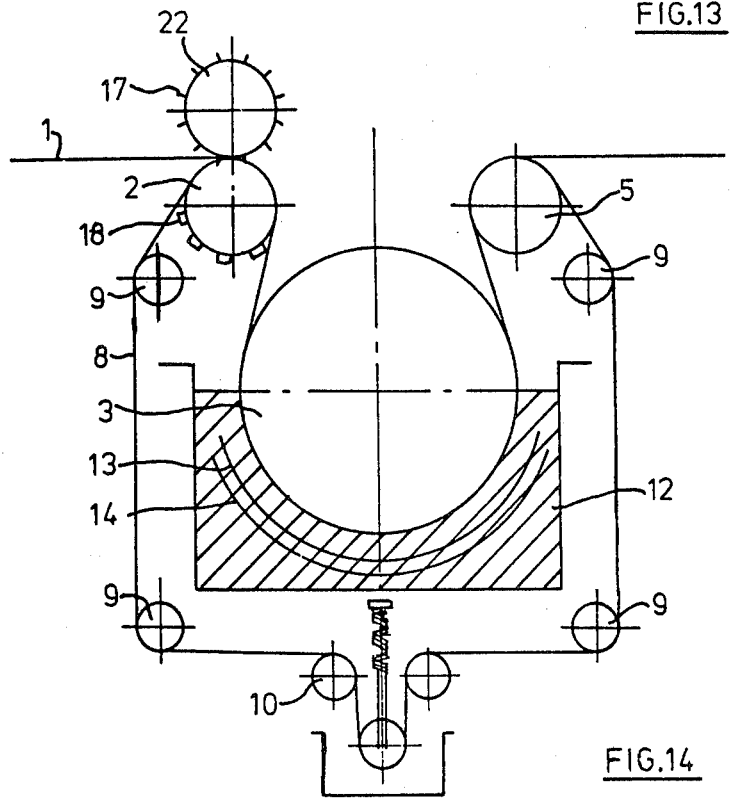
FIG. 14 is a diagrammatic view illustrating another embodiment of the device in accordance with the invention.

In the embodiment shown in FIG. 14, tape 1 is supplied along the guide roller after the required preliminary treatment (not shown). A pair of rollers 2 and 22 are used. Rollers 2 and 22 are coupled in synchronism by means of a gear wheel drive. The roller 22 is provided with pick-up pins 17, which cooperate with the recesses 21 of tape 1. To roller 2, the supporting belt 8 is simultaneously fed along the guide roller 9 and the stretching member 10. The supporting belt 8 has a larger width than tape 1. The supporting belt 8 has recesses 16 (FIG. 13) which correspond to the desired gold patches 15 on the tape 1. By means of projections 18 on the roller 2, the supporting belt 8 is so arranged opposite the tape 1 that the recesses 16 are located accurately at the desired positions.

The pitch or distance 20 of the recesses 16 in the supporting belt 8 is chosen to be smaller than the pitch 19 of the patches in the tape 1. Owing to the elasticity of the supporting belt 8 and with the aid of the stretching member 10 the feed of belt 8 is ensured. The difference between the pitches 20 and 19 of the recesses 16 and 21 (See FIGS. 12 and 13) is preferably more than 0.1% and less than 20%. With smaller differences the pressing force of the belt 8 on the tape 1 is slight during the passage across the electrolyte, which gives rise to unsharp patterns 15. An excessive difference has to be compensated for by an excessive tension of the belt so that deformations of the recesses 16 may be involved.

It will be obvious that by driving wheel 3 or the supporting belt 8 the feed and withdrawal of the tape 1 is performed substantially without stress so that it is possible to treat extremely fine punching patterns in the tape 1 without deformations. It is possible to arrange simultaneously two or more tapes 1 and belts 8 along the wheel.

The pre- and after-treatments such as degreasing, washing and deoxidation are carried out by known methods.

By using an automatic unwinding and winding-up apparatus for the tape 1 a device is obtained, in which during a single passage one or simultaneously a plurality of tapes 1 are provided with a line or patch pattern at a high rate and at low costs.

In a general manner, while there have been disclosed effective and efficient embodiments of the invention, it should be well understood that the invention is not limited to such embodiments, as there might be changes made in the arrangement, disposition, and form of the parts without departing from the principle of the present invention as comprehended within the scope of the accompanying claims.

I claim:

1. An apparatus for continuously electroplating a longitudinally moving elongated strip with a conductive surface, comprising:
   a frame;
   a wheel mounted on said frame for rotation about a horizontal axis and having a circumferential face;
   guide means for guiding said moving strip into engagement with said face over a predetermined portion thereof and in the direction of rotation of said wheel;
   a masking strip continuously guided over said elongated strip for selectively masking areas on said elongated strip which are not to be electroplated;
   a tank; said tank adapted to contain an electrolyte at a predetermined level, said tank being positioned relative to said wheel and framework whereby the lower portion of said wheel is immersed in said electrolyte;
   a tubular member in said tank opposite the circumferential face of said wheel with respect to the portion of said wheel immersed in said electrolyte;
   spray openings in said tubular member and directed toward said face;
   means for supplying electrolyte under pressure to said tubular member; and
   an anode arranged in said tank independently of said tubular member.

2. The apparatus of claim 1 and including means for insuring accurate registration of said masking strip with said elongated strip.

3. The apparatus of claim 1 and including tensioning means for said masking strip.

4. The apparatus of claim 1 and including means for cleaning said masking strip.

5. The apparatus of claim 1 wherein the circumferential face of the wheel is of a resilient material.

6. The apparatus of claim 1 wherein said tubular member is arranged beside the wheel, when seen in a direction perpendicular to the axis of rotation of the wheel.

7. The apparatus of claim 1 and including a second tubular member in said tank.

8. The apparatus of claim 7 and including plural masking strips lying against the outer surface of the elongated strip laterally spaced from each other to expose longitudinal areas on said elongated strip, said tubular members being arranged opposite the exposed portions of the elongated strip.

9. The apparatus of claim 1 wherein a second tubular member is arranged at a distance from the axis of rotation of the wheel.

* * * * *